(12) United States Patent
McCullough

(10) Patent No.: US 6,201,697 B1
(45) Date of Patent: Mar. 13, 2001

(54) HEAT SINK ASSEMBLY WITH CAM LOCK

(75) Inventor: Kevin A. McCullough, Warwick, RI (US)

(73) Assignee: Chip Coolers, Inc., Warwick, RI (US)

(*) Notice: Subject to any disclaimer, the term of this patent is extended or adjusted under 35 U.S.C. 154(b) by 0 days.

(21) Appl. No.: 09/250,587

(22) Filed: Feb. 16, 1999

(51) Int. Cl.[7] ....................................... H05K 7/20
(52) U.S. Cl. .................... 361/704; 254/104; 257/719; 361/719; 403/374; 174/16.3
(58) Field of Search ................... 411/509, 510; 254/104; 403/374, 409.1; 165/80.3, 185; 174/16.3; 257/718, 719, 727; 361/687, 709, 702–704, 710, 722, 717–719, 720

(56) References Cited

U.S. PATENT DOCUMENTS

| Re. 35,573 | 7/1997 | Clemens ................................ 257/719 |
| 2,916,159 | 12/1959 | O'Neill .................................. 211/89 |
| 3,033,537 | 5/1962 | Brown, Jr. .............................. 257/263 |
| 3,229,756 | 1/1966 | Keresztury ............................. 165/67 |
| 3,946,276 * | 3/1976 | Brawn . |
| 4,345,267 | 8/1982 | Corman et al. ......................... 357/81 |
| 4,607,685 | 8/1986 | Mitchell, Jr. ......................... 165/80.3 |
| 4,660,123 | 4/1987 | Hermann ............................... 361/386 |
| 4,745,456 | 5/1988 | Clemens ................................ 357/79 |
| 5,313,099 | 5/1994 | Tata et al. ............................. 257/717 |
| 5,397,919 | 3/1995 | Tata et al. ............................. 257/717 |
| 5,448,449 * | 9/1995 | Bright . |
| 5,586,005 * | 12/1996 | Cipolla . |
| 5,648,890 * | 7/1997 | Loo . |
| 5,708,564 | 1/1998 | Lin ....................................... 361/704 |
| 5,818,695 * | 10/1998 | Olson . |
| 5,841,633 * | 11/1998 | Huang . |
| 5,870,286 * | 2/1999 | Butterbaugh . |
| 5,884,692 * | 3/1999 | Lee . |
| 5,894,408 * | 4/1999 | Stark . |
| 5,930,116 * | 7/1999 | Palmer . |
| 5,987,223 * | 11/1999 | Hamilton . |

FOREIGN PATENT DOCUMENTS 58-176959  10/1983  (JP).

* cited by examiner

Primary Examiner—Gerald Tolin
(74) Attorney, Agent, or Firm—Barlow, Josephs & Holmes, Ltd.

(57) ABSTRACT

A heat sink assembly, having a number of mounting holes therethrough, is installed on a heat generating surface of an electronic component for removing heat therefrom. A heat dissipating member having a base portion having a bottom surface and an upper surface with heat dissipating elements connected thereto is provided. The bottom surface is adapted to be matable in flush thermal communication with a heat generating surface of an electronic component. A cam assembly includes a support body as well as a connection body that is pivotally connected thereto about a pivot axis. At least one leg is connected to the support body with a retention member on its free end. The leg is routed through a selected one of the base apertures and one of the mounting holes corresponding thereto. The connection body is rotated about the pivot axis to provide a camming action against the top surface of the base portion of the heat dissipating member to maintain the heat dissipating member in flush thermal communication with the heat generating surface of the electronic component. The retention member on the leg prevents the leg from being removed from the apertures in which is resides thus maintaining the connection body in communication with the top of the base of the heat dissipating member.

18 Claims, 10 Drawing Sheets

HEAT SINK ASSEMBLY WITH CAM LOCK

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers.

In addition, microprocessors are commonly being installed onto a circuit board which is, in turn, installed into a motherboard or other similar primary circuit board. For example, microprocessors, such as the Pentium II and the Celeron from Intel, are "processor cards" which are installed into a motherboard of a computer in similar fashion to the way a modem is installed into a motherboard. On a given processor card is typically the processor semiconductor device package itself along with any other chips or semiconductor devices that are necessary for the operation of the card, such cache chips, or the like. The processor package may be installed into the processor card via a pin grid, ball grid, land grid array and with a socket such as a ZIF or ball grid socket.

In similar fashion to the earlier semiconductor devices discussed above, the processor cards like the Pentium II and Celeron also suffer from excessive generation of heat. In particular, the processor semiconductor device package on the card generates the heat which is of most concern. A given surface of the component will, as a result, be very hot. If such heat is not properly dissipated, the processor semiconductor device package and the entire processor card or component will eventually fail. Understanding the need for heat dissipation and the connection of heat sinks, the manufacturers of processor cards typically include holes completely or partially through the processor card to facilitate the installation of heat sink assemblies thereto. Commonly, an array of at least four holes are present to receive heat sink devices.

In view of the foregoing, efforts have been made to supply a heat dissipating member, such as a heat sink, into thermal communication with the processor card and more specifically, the processor semiconductor device package. These efforts commonly employ the available holes present in the processor card to serve as anchors for the receipt of a heat sink assembly. For example, prior art attempts include an extruded heat sink assembly with a base and an array of fin members emanating upwardly therefrom. The base includes a number of through holes which correspond with the arrangement of the holes provided by the manufacturer of the processor card. The heat sink assembly is secured to the processor card by screws which are hand-tightened to the desired tension and communication between the base of the heat sink and the processor card. These heat sinks attach directly to the heat generating package or the housing containing the package, such as in a Pentium II environment.

In addition, heat sink assemblies have also been available which provide a heat sink base and associated fins along with a spring clip which engages the holes in the processor card and spans across the heat sink base to secure it in place. While relative easy to install, this attempt in the prior art is not capable of fast tension adjustment of communication between the heat sink base and surface to be cooled and requires tools for installation.

In addition to the processor cards of the prior art, processor semiconductor device packages may also be installed directly into a main circuit board, such a motherboard, in similar fashion to the older Pentium or 486 processor packages. Some manufacturers are also providing through holes in the motherboard itself to permit the attachment of heat sink assemblies as an alternative to attaching the heat sink assembly to the semiconductor package itself or the socket into which it is installed. In similar fashion to the processor cards discusses above, these processor package arrangement suffer from similar problems associated with the attachment of heat sink assemblies to avoid overheating problems.

In view of the foregoing, there is a demand for a heat sink assembly that attach to a heat generating semiconductor device package without attaching to the semiconductor package itself. In addition, there is a demand for a heat sink assembly that can quickly and easily attach to holes provided proximal to the device to be cooled without the need for tools for installation.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling microprocessor integrated circuit devices, such as Pentium II and Celeron semiconductor device packages. The heat sink assembly of the present invention enables the simple, easy and inexpensive assembly, use and maintenance of a heat sink assembly while realizing superior heat dissipation.

A heat sink assembly, having a number of mounting holes therethrough, is installed on a heat generating surface of an electronic component for removing heat therefrom. A heat dissipating member having a base portion having a bottom surface and an upper surface with heat dissipating elements connected thereto is provided. The bottom surface is adapted to be matable in flush thermal communication with a heat generating surface of an electronic component. A cam assembly includes a support body as well as a connection body that is pivotally connected thereto about a pivot axis. At least one leg is connected to the support body with a retention member on its free end. The leg is routed through a selected one of the base apertures and one of the mounting holes corresponding thereto. The connection body is rotated about the pivot axis to provide a camming action against the top surface of the base portion of the heat dissipating member to maintain the heat dissipating member in flush thermal communication with the heat generating surface of the electronic component. The retention member on the leg prevents the leg from being removed from the apertures in which is resides thus maintaining the connection body in communication with the top of the base of the heat dissipating member.

In operation, the legs of the cam lock assembly are installed through selected base apertures and corresponding mounting holes in the electronic component. The free ends of the legs carry retention members which pass through the holes and apertures to provide stop members on the opposing side of the circuit board or electronic component. The armature emanating from the connection body is manipulated to rotate the connection body about the pivot axis thereby causing the portion of the connection body with the greater transverse distance from the pivot axis to engage the top of the base portion of the heat dissipating member to urge the base portion into flush thermal communication with the heat generating surface of the electronic component where the stops are snugly positioned against the back of the circuit board or electronic component to prevent removal of the legs. As a result of the flush thermal communication of the bottom of the heat sink assembly and the heat generating surface, efficient thermal transfer to the heat dissipating member can be realized.

It is therefore an object of the present invention to provide a heat sink assembly which can accommodate a wide array of semiconductor device packages.

It is an object of the present invention to provide a heat sink assembly that can accommodate a semiconductor device mounted on a processor card.

It is a further object of the present invention to provide a heat sink assembly that can accommodate a semiconductor device without attaching to the device itself or the socket into which it is installed.

Another object of the present invention is to provide a heat sink assembly that can quickly and easily attach to a circuit board carrying a semiconductor device package.

It is a further object of the present invention to provide a heat sink assembly that can be locked without the use of tools to provide a flush thermal communication between the heat sink member and the device or surface to be cooled.

It is yet a further object of the present invention to provide a heat sink that can attach to and cool a heat generating surface.

It is also an object of the present invention to provide a heat sink that can be both easily installed on a heat generating surface and tension adjusted without the use of tools.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 12:
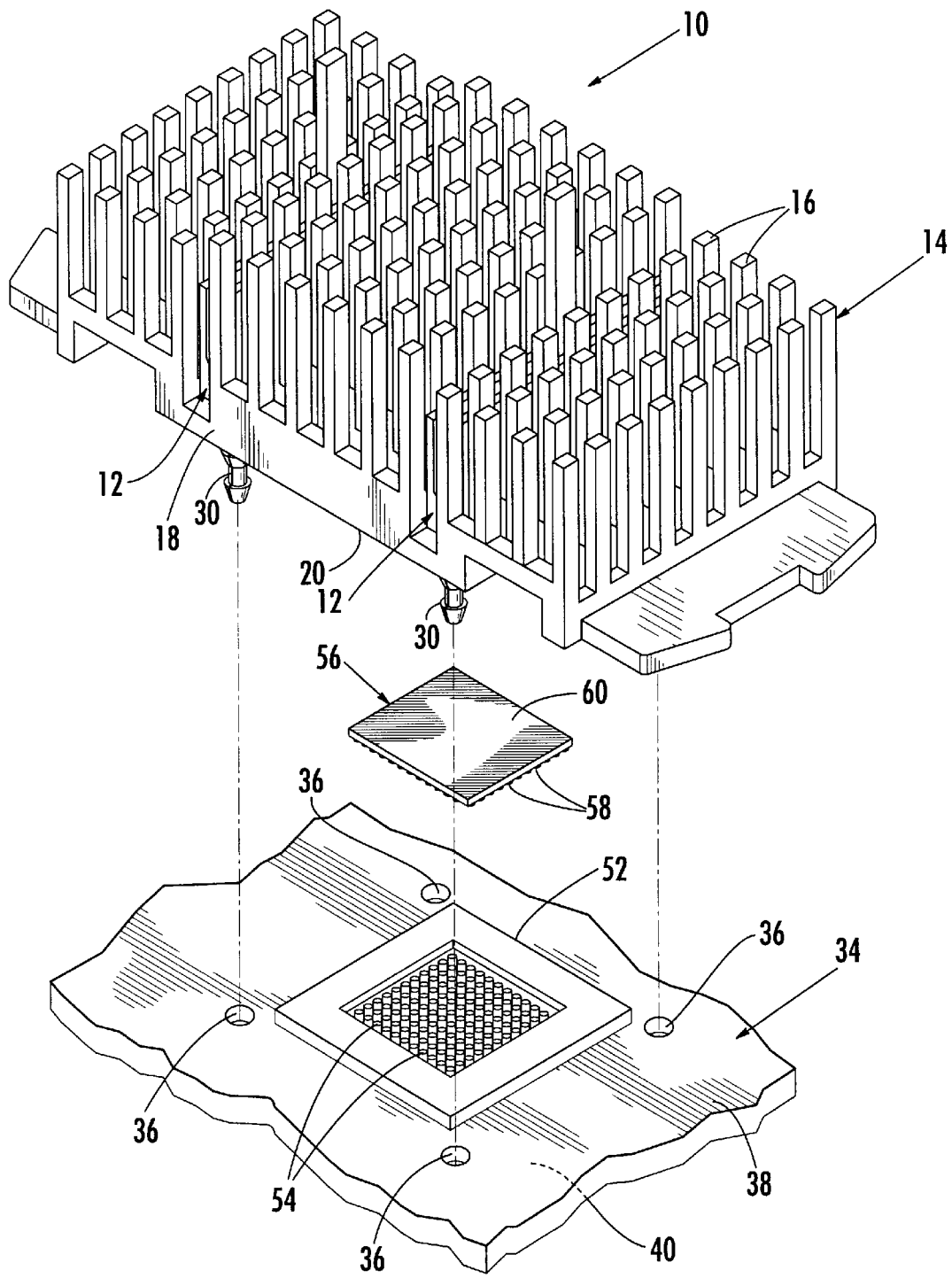
FIG. 12 is a perspective view of the heat sink assembly of the present invention illustrating the ability to be installed on a circuit board carrying a BGA socket semiconductor device package arrangement.
Figure 13:
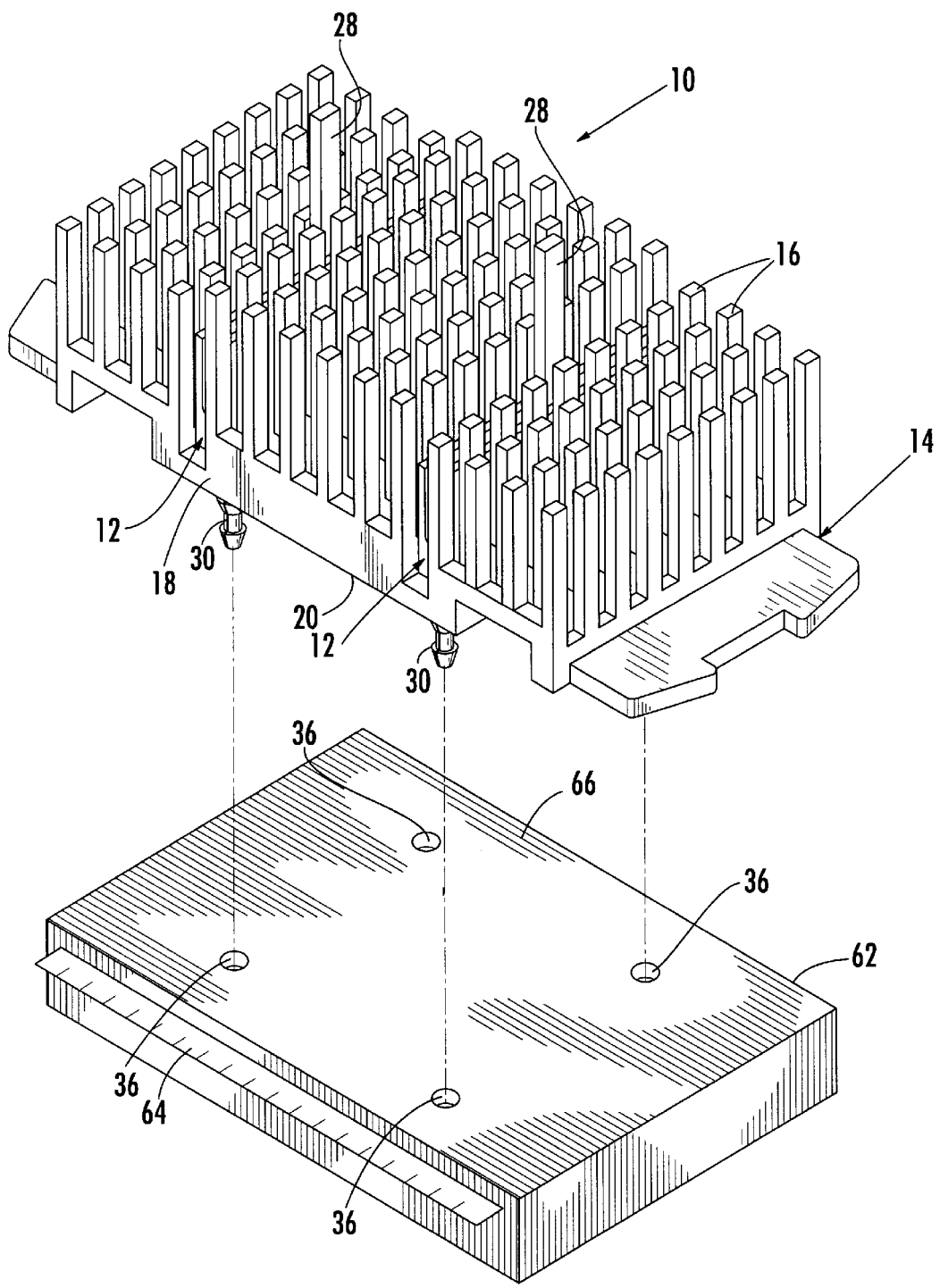
FIG. 13 is a perspective view of the heat sink assembly of the present invention illustrating the ability to be installed on the housing an edge connector type semiconductor package.

It should be noted that the present invention provides a heat sink assembly 10 for attachment to any semiconductor device package attached to a circuit board with an array of holes completely therethrough or partially therethrough. The present invention is shown in FIGS. 1–11 as attaching to a surface mount semiconductor device package 42 is for illustration purposes only. It should be understood that various other types of semiconductor packages may be installed on a circuit board and accommodated by the present invention. FIG. 12, as discussed in detail below, illustrates the attachment of the present invention to a BGA semiconductor device package 56 within a BGA socket 52 to illustrate the flexibility of applications of the present invention. FIG. 13 shows a further application to attach to a heat generating surface.

Further, for ease of illustration, the following description addresses the attachment of the heat sink assembly of the present invention to a semiconductor package installed on a circuit board. This is intended to the include an a semiconductor arrangement where the circuit board is a "semiconductor card," such as a Pentium II or Celeron product, or where the circuit board is the motherboard or main circuit board itself. It further includes an arrangement, as in a Pentium II processor, where the circuit board is encased in a housing which includes holes therein. In this arrangement, an outer surface of the housing will generate heat, as shown in FIG. 13. The present invention is, therefore, suitable for dissipating heat generated by a given surface of an electronic component. As will be readily apparent, the heat sink assembly of the present invention can accommodate a wide range of semiconductor arrangements where holes are provided proximal to the package or surface to be cooled.

Figure 1:
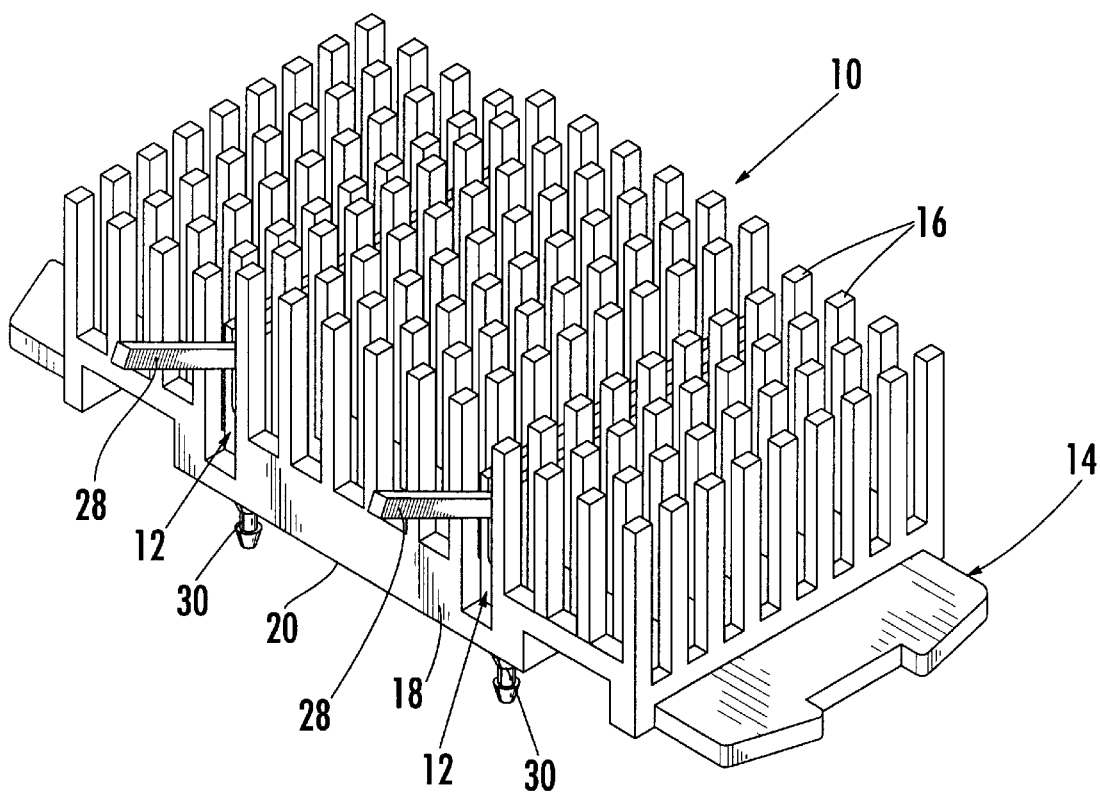
FIG. 1 is a perspective view of the heat sink assembly of the present invention with cam locks installed.
Figure 2:
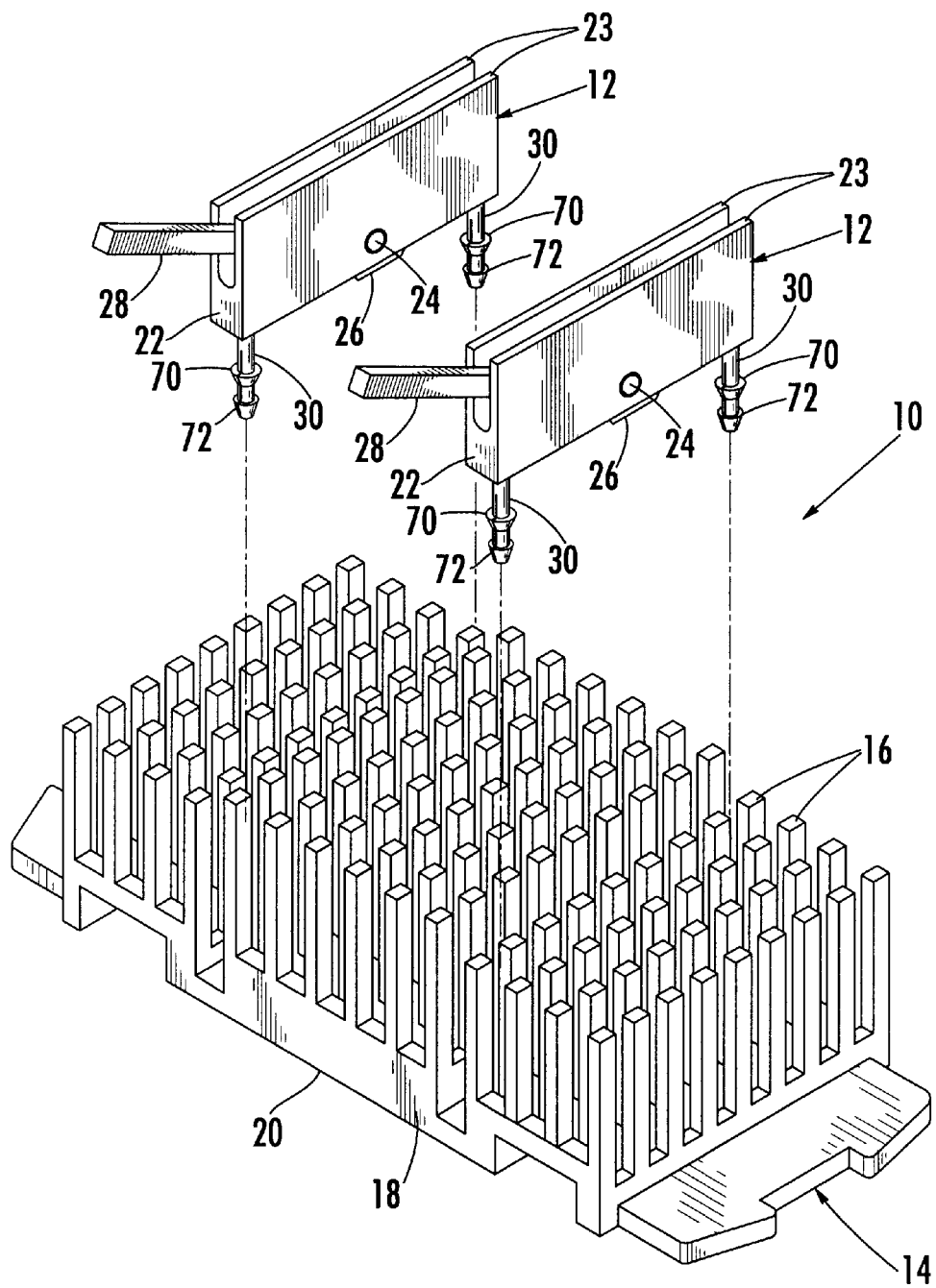
FIG. 2 is an exploded perspective view of the heat sink assembly of the present invention shown in FIG. 1.

Referring to FIGS. 1 and 2, the preferred embodiment of the heat sink assembly 10 of present invention is generally shown to include a heat dissipating member 14 with a base portion 18 and a number of fins 16 extending upwardly therefrom. Cam lock assemblies 12 are provided each with a pair of legs 30 which extend downwardly therefrom. The length of legs 30 may be selected to accommodate the particular size of the member to be cooled. Each assembly 12 includes an armature 28 for securing the cam lock in a locked position. Further, as will be discussed in detail below, bottom surface 20 of heat dissipating member 14 communicates with a heat generating surface and cam lock assemblies ensure that such communication is securely maintained.

Figure 3A:
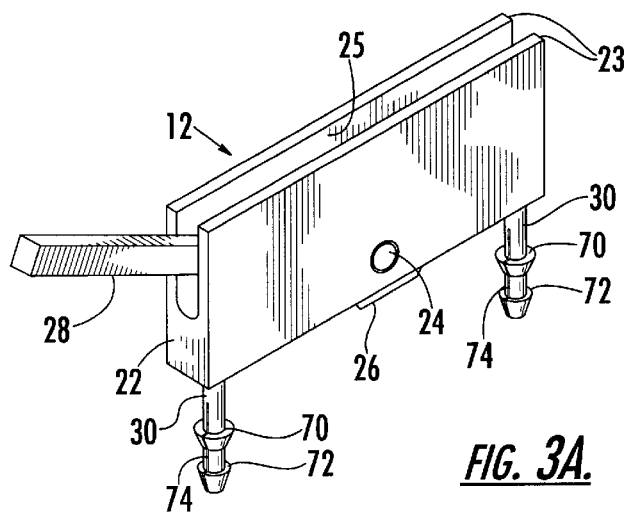
FIG. 3A is a perspective view of a cam lock of the present invention in an unlocked position.
Figure 3B:
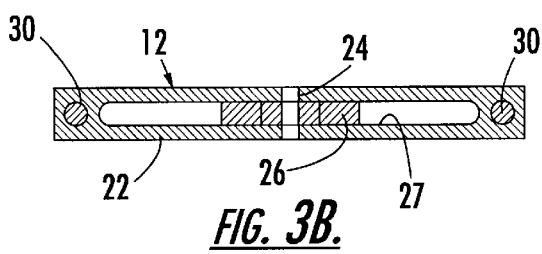
FIG. 3B is a bottom view of the cam lock of FIG. 3A.
Figure 4:
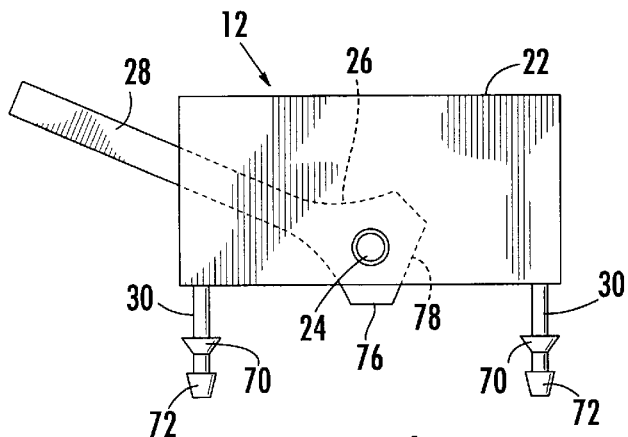
FIG. 4 is a side view of the cam lock of the present invention in FIG. 3 in a locked position.
Figure 5:
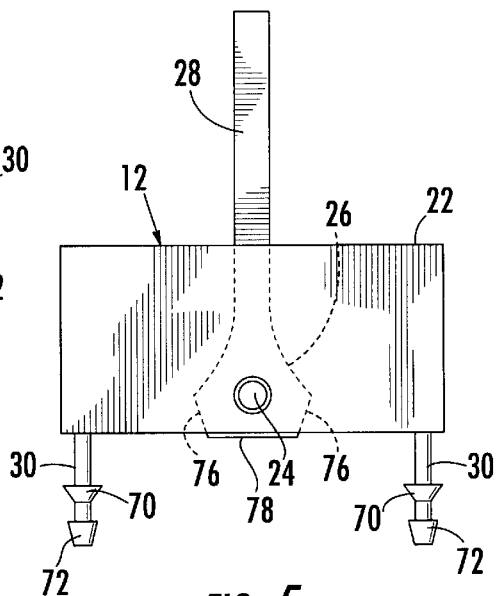
FIG. 5 is a side view of the cam lock of the present invention in FIG. 3 in an unlocked position.

Turning now to FIGS. 3–5 details of the cam lock assembly 12 is shown. In general, it should be understood that for illustration purposes only, 2 cam lock assemblies 12 shown to accommodate the particular heat dissipating member 14 shown in FIGS. 1 and 2. In certain applications only one cam lock assembly 12 may be required and, further, more or less than 2 legs may be employed by cam lock assembly 12 to address the given application. For ease of illustration, discussion of the cam lock assemblies 12 will be discussed in connection with a single cam lock assembly as the operation of all cam lock assemblies with a give heat sink assembly 10 are identical.

FIG. 3A illustrates a perspective view of the cam lock 12 in accordance with the present invention while FIG. 4 illustrates the cam lock 12 in a locked position and FIG. 5 illustrates the cam lock 12 in an opened position. The cam lock 12 includes a support body 22 with, preferably a pair of upstanding walls 23. A pivot pin 24 is transversely positioned through body 22. A pair of legs 30 are provided each with an upper circumferential flange 70 and a lower circumferential flange 72. To facilitate compression of legs 30, slot 74 is provided longitudinally up from the free ends of legs 30 a selected distance at least up past upper flange 70. The legs 30 may be made of compressible plastic so that slot 74 need not be used. The legs preferably emanate downwardly from support body 22. As shown in FIG. 3B, a bottom view of the cam lock 12 shown in FIG. 3A, cam plate 26 is pivotally connected to support body 22 via pin 24. Cam plate 26 is permitted to rotate within cavity 27 with support body 22.

Turning now to FIGS. 4 and 5, pivotal rotation of cam plate 26 is shown in further detail. With the assistance of armature 28, cam plate 26 may be easily rotated about pin 24. FIG. 4 illustrated the rotation of cam plate 26 into a locked position. In particular, cam plate 26 includes a configuration where at different portions of the cam plate 26, the length from pin 24 to an outer edge is different. In particular, edge 78 and edges 76 are provided. Movement of armature 28 to the side position shown in FIG. 4 causes edge 76 to emanate down below the lower edge of support body 22. In contrast, movement of armature 28 to an upward position, as shown in FIG. 5, causes rotation of cam plate 26 and edge 78 to be the downwardmost edge. Since the distance from pin 24 to edge 78 is less than the distance from pin 24 to edge 76, positioning armature in the position shown in FIG. 5 causes cam plate 26 to not protrude as far down as if the armature is positioned to the side as in FIG. 4. As will be discussed in detail below the rotational movement of cam plate 26, facilitated by armature 28, will effectively lock the heat sink assembly in place onto a heat generating surface. It should also be understood that two different distances from pin 24 are shown to designate a locked and open condition. Additional distances and more than two edges may be employed to accommodate different height processors, or the like. For example, edges 76 are shown to have the same distance from pin 24. Alternatively, one of the edges could be different than the other edge 76 and further different than edge 78 to accommodate processors of different thicknesses by the same cam lock assembly.

Figure 6:
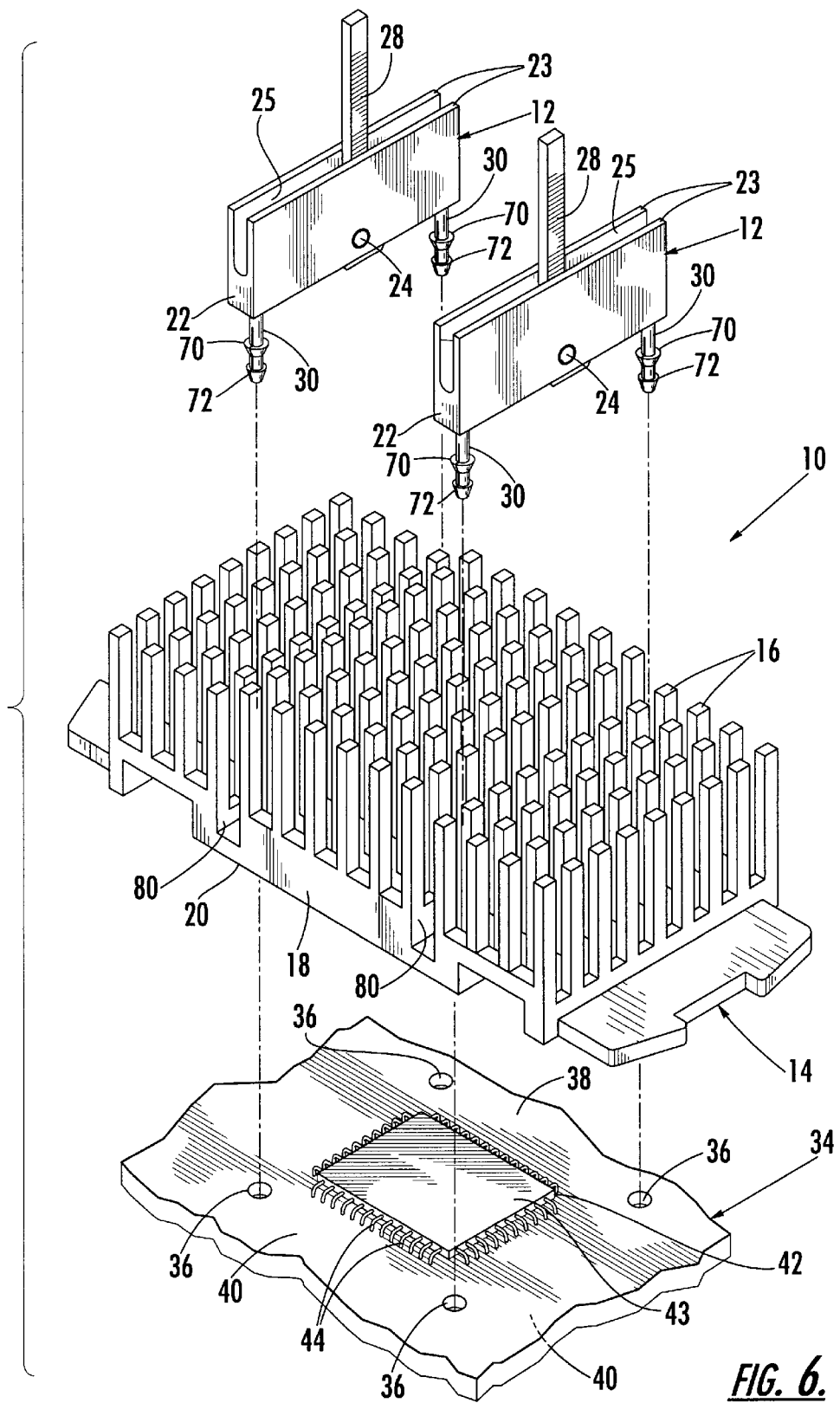
FIG. 6 is an exploded perspective view of the heat sink assembly of the present invention illustrating attachment to a semiconductor device package on a circuit board.

Referring now to FIGS. 6–11, details of the assembly and installation of the heat sink assembly 10 of the present invention is shown. FIG. 6 illustrates an exploded perspective view of the heat sink assembly 10 in a position to be installed on circuit board 34. In this arrangement, two cam lock assemblies 12 are provided each with a pair of legs 30 for routing through holes 19, as in FIG. 8, and through holes 36 through circuit board 34. Channels 80 are provided within pin grid array 16 to facilitate installation of cam lock assemblies 12.

Figure 7:
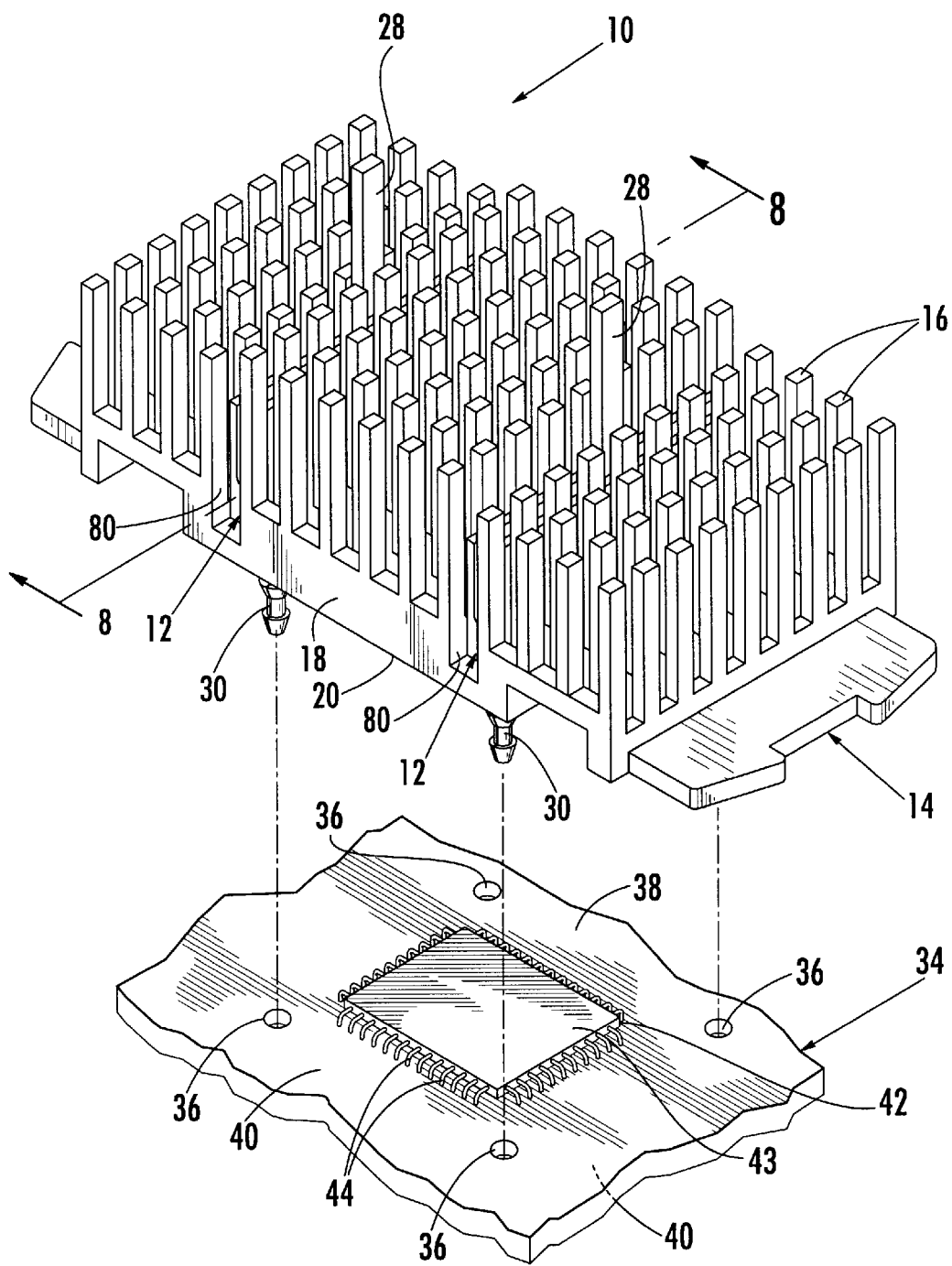
FIG. 7 is a partially exploded view of the heat sink assembly of the present invention illustrating interconnection of the cam locks to a circuit board carrying a semiconductor device to be cooled.
Figure 8:
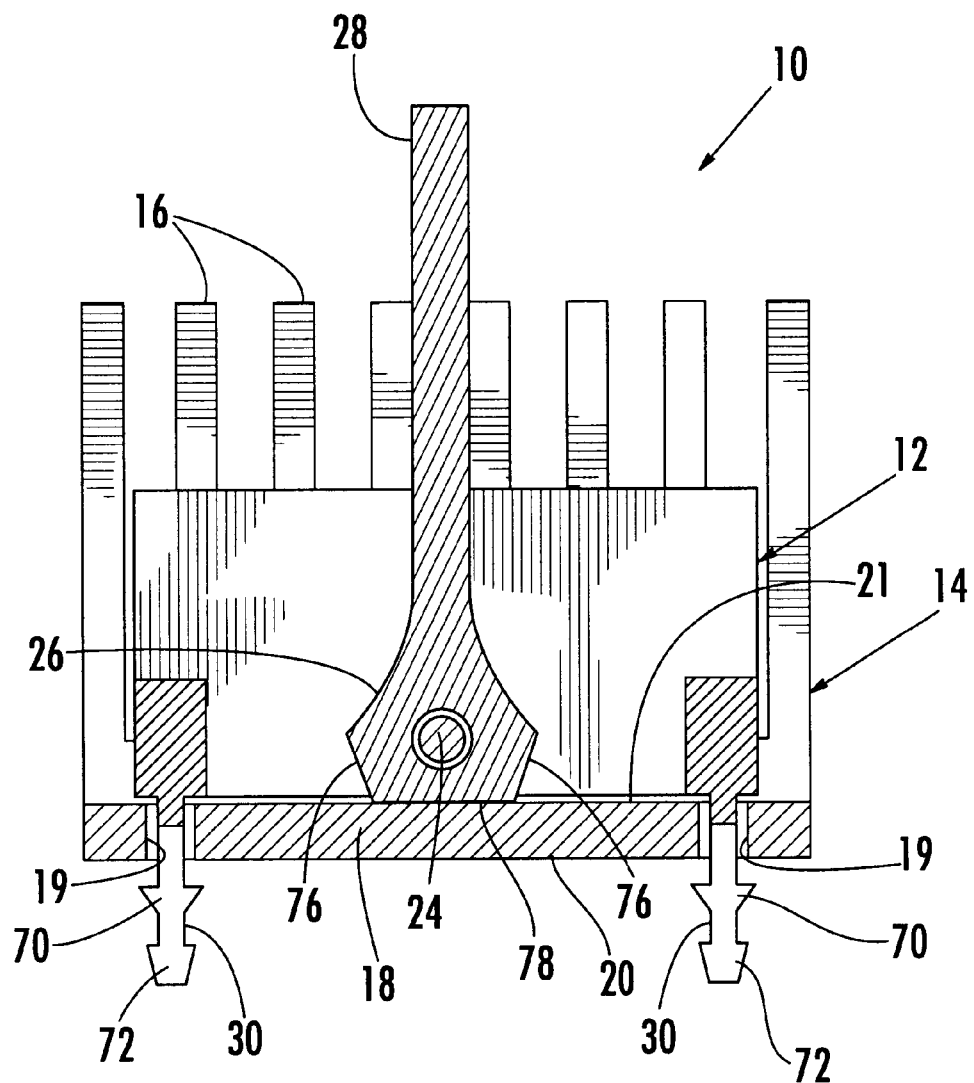
FIG. 8 is a cross-sectional view through the line 8—8 of FIG. 7.

Referring to FIGS. 6–8, both of the cam lock assemblies 12 are installed into corresponding holes 19 through base 18 of heat dissipating member 14. FIG. 8 shows a cross-sectional view through the line 8—8 of FIG. 7 to further illustrate the routing of legs 30 through holes 19 in base 18. Legs 30 are routed into corresponding holes 19 in base 18 so that both sets of flanges 70 and 72 clear past the bottom surface 20 of base 18. The compressibility of flanges 70 and 72 permits legs 30 to be routed into holes 19 in one-way fashion in that once the flanges 70 and 72 clear the bottom of base 18, they will expand preventing easy removal.

Once both of the cam locks 12 are installed into heat dissipating member 14, the assembled structure can now be installed on the desired heat generating device. Referring to FIG. 7 the assembled structure is generally aligned with corresponding holes 36 on circuit board 34. First, the pair of legs 30 on one of the cam lock assemblies 12 is routed through corresponding holes 36 so that lower flanges 72 clear past holes 36. This routing is accomplished by simply pressing on the heat dissipating member 14 itself without the use of tools. The bottom surface 20 of base 18 engages with top flanges 70 of the pair of legs 30 to urge this pair of legs 30 through corresponding holes 36. Once the legs 30 associated with one cam lock 12 are installed, the opposing pair of legs associated with the other cam lock 12 may now be installed. The entire heat dissipating member 14 is tilted to take up the slack between top flanges 70 of the first pair of legs and support body 22 to permit the second pair of legs to be routed into their corresponding holes 36 with the assistance of the bottom surface 20 of base 18 urging against top flanges 70. This two step installation of the two pairs of legs 30 must be done so that the heat sink assembly 10 may be installed properly onto a semiconductor device 42 that must have a height, including circuit board, that is greater than the distance from flanges 70 to 72 so that, as will be seen below, the bottom surface 20 of base 18 contacts semiconductor device 42 not top flanges 70.

Figure 9:
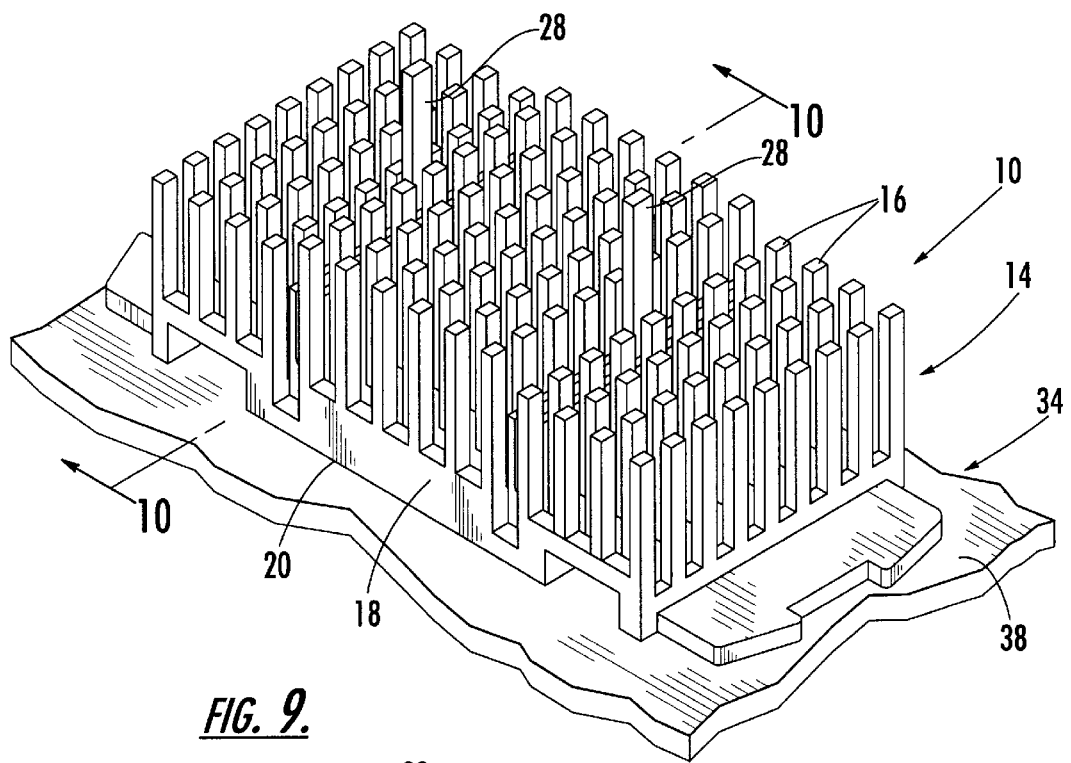
FIG. 9 is perspective view of the heat sink assembly of the present invention installed on a circuit board and in an unlocked condition.
Figure 10:
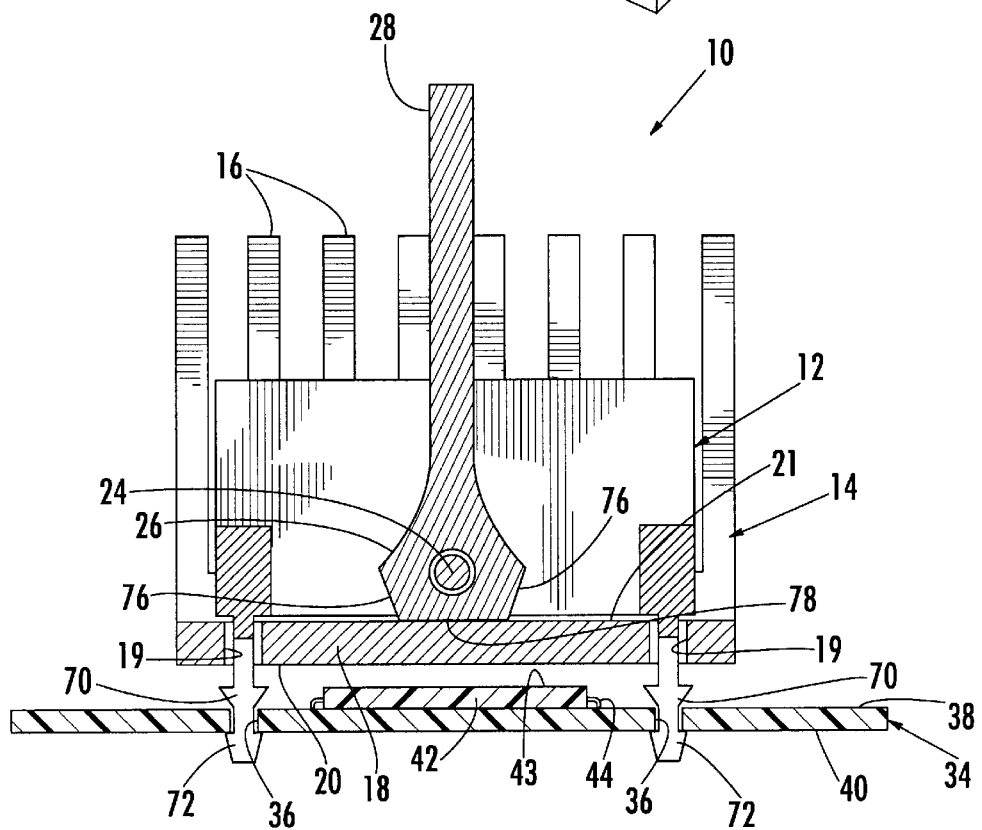
FIG. 10 is a cross-sectional view through the line 10—10 of FIG. 9 with cam lock in an open position.
Figure 11:
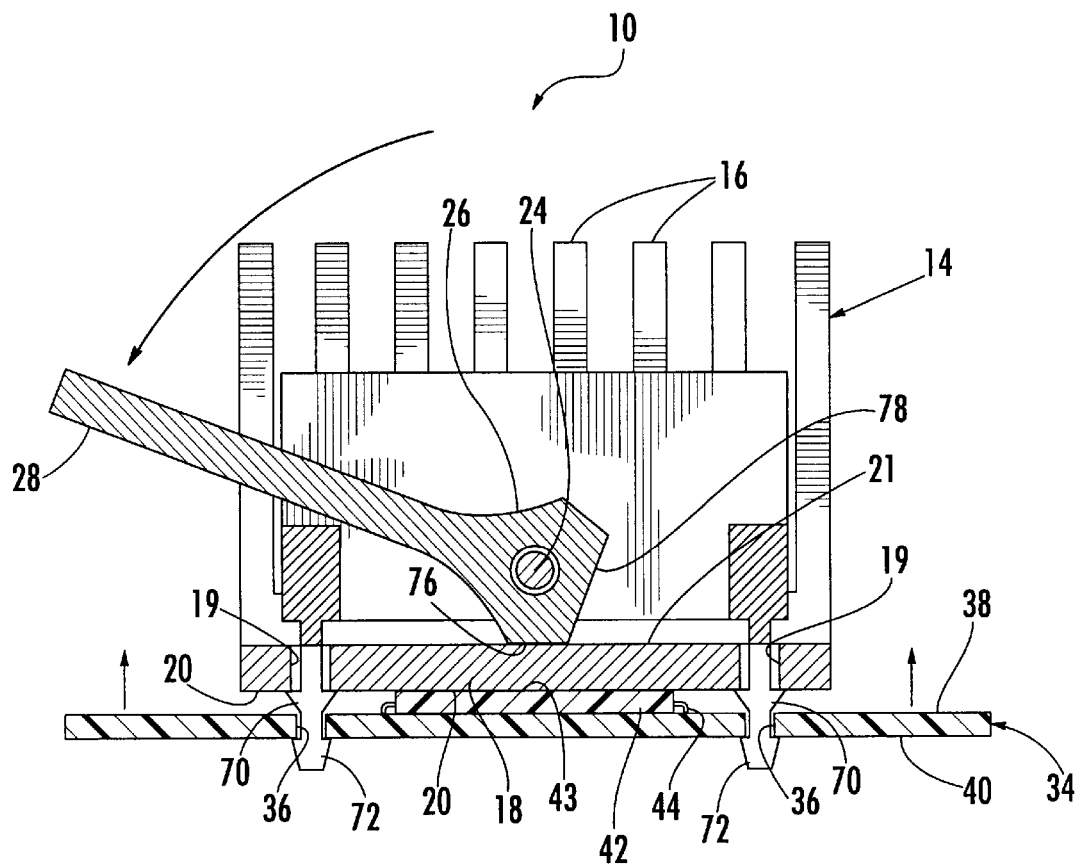
FIG. 11 is a cross-section view through the line 10—10 of FIG. 9 with cam lock in a locked position.

Now that the heat sink assembly 10 has now been initially attached to the device to be cooled, as shown in FIG. 9, it can now be locked into place as shown in FIGS. 10 and 11; namely, the slack between the bottom surface 20 of base 18 and the top surface 43 of semiconductor device 42 can now be eliminated. In FIG. 10, a cross-sectional view through the line 10—10 of FIG. 9, this slack can be seen. This slack is necessary for preparation for the installation of the heat sink assembly 10. In FIG. 10, armature 28 is positioned upwardly so that edge 78 contacts top surface 21 of base 18. In FIG. 11, armature 28 is rotated counter-clockwise about pin 24 to cause base 18 to lift off of edge 78. As a result, edge 76 now is urged into communication with top surface 21 of base 18 thus urging bottom surface 20 of base 18 into flush communication with the top surface 43 of semiconductor device 42 to be cooled. Engagement of bottom flanges 72 with holes 36 prevent removal of legs 30 from holes 36. It should be noted that while the heat sink assembly 10 is locked in place, upper flanges 70 are not used. Flanges 70 are only used during the initial installation of legs 30 through holes 36.

It should be understood that heat sink assembly 10 is employed to dissipate heat from heat generating semiconductor device package 42 which includes a top surface 43 and is electrically interconnected to circuit board 34 via electrical interconnections 44. Circuit board 34, as commonly found in the industry, includes a number of holes 36 positioned about the semiconductor package 42 to be cooled. the assembly 10 is illustrated to provide four downwardly depending legs 30 to communicated with corresponding four holes 36 through circuit board 34. It should be understood that the provision of four legs 30 and four corresponding receiving holes 36 is by way of example only and that fewer or greater than four legs 30 and corresponding receiving holes 36 may be provided in accordance with the application at hand. Further, individual cam locks 12 may be provided for each hole 36 where each cam lock 12 has a single leg 30. In the alternative, a single cam lock assembly 12 may be provided with four legs connected to a single support body 22. Also, armature 28 may be offset relative to what is shown in FIG. 11 so that locking occurs when armature 28 is vertical as opposed to the side. Such alternate positioning of armature 28 may be selected in accordance with the application at hand and the configuration and height of heat dissipating member 14.

FIG. 12 illustrates an alternative application of the heat sink assembly 10 to a BGA package and socket arrangement. In particular, circuit board 34 carries BGA socket 52 with contact array 54 thereon. Positioned about socket 52 is an array of holes 36. BGA package 56, with ball array 58, communicates with socket 52 and ball array 58 electrically communicates with contact array 54. As described above, assembly 10 is installed into circuit board 34 with flanges 72 engaging below holes 36. Heat sink 14 is secured so that bottom surface 20 of base 18 contacts top surface 60 of BGA package 56. Locking of cam lock 12 not only provides a quality thermal connection between heat dissipating member 14 and BGA package 56 but also maintains BGA package in electrical connection between ball array 58 and contact array 54 of its socket 52.

As can be understood from the application in FIG. 12, the present invention has a wide range of applications and can be easily adapted for such applications. Further applications include any circuit board configuration where a heat generating device is provided on a circuit board or similar substrate and where a receiving structure, such as an array of holes, are provided. The present invention may be easily adapted to an application where the circuit board containing the heat generating device is encased in a housing, such as a Pentium II configuration. In this arrangement, as shown in FIG. 13, receiving structures, such as holes or slots 36, are provided in the housing 62 with electrical interconnect 64, which are capable of receiving the legs 30 so that heat dissipating member 14 can be placed in flush thermal communication with a heat generating region 66 of the surface of housing 62 which is proximal to the heat generating device contained therein.

It is preferred that the cam lock assemblies 12 be manufactured of plastic material, such as a high temperature resistant and high creep resistant plastic for better withstanding the high temperatures associated with microprocessors. Cam lock assemblies may be made of a combination of metal an plastic where some parts are manufactured of metal and other parts are manufactured of plastic. For example, the plastic material may be LNP VERTON UF-700-10-HS (P.P.A. 50% long fiber) for use in high temperate heat sink applications. In addition, heat dissipating member 14 is preferably metal, such as aluminum, for optimum thermal transfer and dissipation of heat from semiconductor device packages 42. Alternatively, heat dissipating member 14 may be manufactured of a conductive plastic material if so desired and depending on the application. Fins 16 are provided in a pin grid array but various other heat sink fin configurations, such as a radial fin array, may be employed.

It would be appreciated by those skilled in the art that various changes and modifications can be made to the illustrated embodiments without departing from the spirit of the present invention. All such modifications and changes are intended to be covered by the appended claims.

What is claimed is:

1. A heat sink assembly removing heat from an electronic component having a heat generating surface and a plurality of mounting holes therein, comprising:

a heat dissipating member having a base portion having a bottom surface and an upper surface with heat dissipating elements connected thereto; said bottom surface in flush thermal contact with a heat generating surface of an electronic component; said base portion defining a plurality of base apertures therethrough; said base apertures being substantially aligned with a plurality of mounting holes through the heat generating surface of said electronic component;

a cam assembly having a support body; said cam assembly furthering including a connection body pivotally connected thereto about a pivot axis; said connection body having a first transverse dimension extending away from said pivot axis in a perpendicular direction defining an open position and a second transverse dimension, greater than said first transverse dimension, extending from said pivot axis in a perpendicular direction different than said first transverse dimension by a predetermined number of degrees about said pivot axis defining a locked position with said connection body contacting said upper surface of said base portion urging said bottom surface of said base portion of said heat sink assembly into flush thermal contact with said heat generating surface; at least one leg having a free end with an opposing end connected to said support body in a direction substantially perpendicular to said pivot axis; a retention member connected to said free end of said at least one leg; said at least one leg being routed through a selected one of said base apertures and one of said mounting holes corresponding to said selected one of said base apertures; said retention member preventing said free end of said at least one leg from being withdrawn from said selected base aperture and corresponding mounting hole upon pivoting of said connection body from said open position to said locked position.

2. The heat sink assembly of claim 1, further comprising an elongated armature connected to said connection body in a direction perpendicular to said pivot axis.

3. The heat sink assembly of claim 1, wherein said retention member includes a stop; said stop communicating with said electronic component about said holes.

4. The heat sink assembly of claim 3, wherein said free end of said at least one leg is compressible at its respective free end permitting clearance of said stop upon routing of said free end of said at least one leg into said selected base aperture and corresponding mounting hole.

5. The heat sink assembly of claim 3 wherein said at least one leg further defines a slot extending upwardly from its respective free end a predetermined distance and across the entire width thereof; said at least one leg being compressible at its respective free end permitting clearance of said stop upon routing of said free end of said at least one leg into said selected base aperture and corresponding mounting hole in said electronic component.

6. The heat sink assembly of claim 1, wherein said electronic component is a processor card installable on a motherboard.

7. The heat sink assembly of claim 1, wherein said electronic component is a semiconductor device package installed on a circuit board.

8. The heat sink assembly of claim 1, wherein said electronic component is a ball grid array semiconductor device installed in a socket affixed to a circuit board.

9. The heat sink assembly of claim 1, wherein said semiconductor device package is a surface mounted semiconductor device package installed on a circuit board.

10. The heat sink assembly of claim 1, wherein said cam assembly includes a pair of legs connected to said support body at opposing ends thereof; said connection body being pivotally connected to said support body between said pair of legs.

11. The heat sink assembly of claim 10, wherein said pair of legs are routed and engaged with a pair of base apertures and a corresponding pair of mounting holes.

12. The heat sink assembly of claim 10, further comprising:

two cam assemblies each having a pair of legs routed and engaged with respective pairs of base apertures and corresponding pairs of mounting holes; said cam assemblies being positioned a distance from one another.

13. The heat sink assembly of claim 1, wherein said cam assembly is manufactured of metal.

14. The heat sink assembly of claim 1, wherein said cam assembly is manufactured of plastic.

15. The heat sink assembly of claim 1, wherein said support body and said at least one leg of said cam assembly is manufactured of metal.

16. The heat sink assembly of claim 1, wherein said connection body is manufactured of plastic.

17. The heat sink assembly of claim 1, wherein said heat dissipating member is manufactured of metal.

18. A cam lock assembly, comprising:

a circuit board having a circuit board hole therethrough;

a semiconductor device mounted on said circuit board;

a heat dissipating member having a heat dissipating hole;

a support body;

a leg, having a free end, connected to said support body;

a retention member disposed at said free end of said leg; said leg being routed through said heat dissipating member hole and said circuit board hole and retained therein by said retention member;

a cam member pivotally connected to said support body and rotatable between a locked position and an open position; and said cam member being rotated into said locked positioned and into communication with said heat dissipating member; said heat dissipating member being in flush thermal contact with said semiconductor device.

* * * * *